United States Patent
Reber et al.

(10) Patent No.: US 10,957,528 B2
(45) Date of Patent: Mar. 23, 2021

(54) SILICON WAFER FOR AN ELECTRONIC COMPONENT AND METHOD FOR THE PRODUCTION THEREOF

(71) Applicant: NexWafe GmbH, Freiburg (DE)

(72) Inventors: Stefan Reber, Gundelfingen (DE); Kai Schillinger, Freiburg (DE); Frank Siebke, Merzhausen (DE)

(73) Assignee: NexWafe GmbH, Freiburg (DE)

( * ) Notice: Subject to any disclaimer, the term of this patent is extended or adjusted under 35 U.S.C. 154(b) by 86 days.

(21) Appl. No.: 16/095,499

(22) PCT Filed: Apr. 11, 2017

(86) PCT No.: PCT/EP2017/058674
§ 371 (c)(1),
(2) Date: Oct. 22, 2018

(87) PCT Pub. No.: WO2017/182329
PCT Pub. Date: Oct. 26, 2017

(65) Prior Publication Data
US 2019/0131121 A1  May 2, 2019

(30) Foreign Application Priority Data

Apr. 22, 2016  (DE) .................. 10 2016 107 557

(51) Int. Cl.
*H01L 21/00* (2006.01)
*H01L 21/02* (2006.01)
*H01L 31/18* (2006.01)

(52) U.S. Cl.
CPC .... *H01L 21/02005* (2013.01); *H01L 21/0262* (2013.01); *H01L 21/02381* (2013.01);
(Continued)

(58) Field of Classification Search
CPC ......... H01L 21/02005; H01L 21/02381; H01L 21/02532; H01L 21/02576; H01L 21/02579; H01L 21/0262; H01L 31/1804
See application file for complete search history.

(56) References Cited

U.S. PATENT DOCUMENTS

2013/0316095 A1  11/2013  Reber et al.

FOREIGN PATENT DOCUMENTS

| CA | 721884 | 11/1965 |
|---|---|---|
| DE | 102015118042 | 4/2017 |
| WO | 2012084187 | 6/2012 |

OTHER PUBLICATIONS

Brendel, Rolf, "Review of Layer Transfer Processes for Crystalline Thin-Film Silicon Solar Cells", Japanese Journal of Applied Physics, Japan Society of Applied Physics, vol. 40, No. 7, Part 01, pp. 4431-4439, Jul. 1, 2001.

(Continued)

*Primary Examiner* — Richard A Booth
(74) *Attorney, Agent, or Firm* — Volpe Koenig

(57) ABSTRACT

A method for producing a silicon wafer for an electronic component, having the method step of epitaxially growing of a silicon layer on a carrier substrate and removing the silicon layer as a silicon wafer from the carrier substrate, in which at least one p-dopant and at least one n-dopant are introduced into the silicon layer during the epitaxial growth. The dopants are introduced into the silicon layer such that the silicon layer is formed having an electrically active p-doping and an electrically active n-doping, each greater than $1\times10^{14}$ cm$^{-3}$.

7 Claims, 1 Drawing Sheet

(52) U.S. Cl.
CPC .. *H01L 21/02532* (2013.01); *H01L 21/02576* (2013.01); *H01L 21/02579* (2013.01); *H01L 31/1804* (2013.01)

(56) References Cited

OTHER PUBLICATIONS

Dubois, S., et al., "Beneficial Effects of Dopant Compensation on Carrier Lifetime in Upgraded Metallurgical Silicon", the compiled state-of-the-art of PV solar technology and deployment: 23rd European Photovoltaic Solar Energy Conference, Valencia, Spain, Sep. 1-5, 2008.

Samsonidze, Georgy, et al., "Compensation-Doped Silicon for Photovoltaic Applications", Physical Review B, Condensed Matter and Materials Physics, vol. 84, No. 19, Nov. 1, 2011.

Cuevas, Andres, et al., "Compensation Engineering for Silicon Solar Cells", Sciverse Science Direct, vol. 15, pp. 67-77, Jan. 1, 2012.

Schmich, Evelyn, et al., "Silicon CVD Deposition for Low Cost Applications in Photovoltaics", Science Direct, vol. 201, No. 22-23, pp. 9325-9329, Aug. 9, 2007.

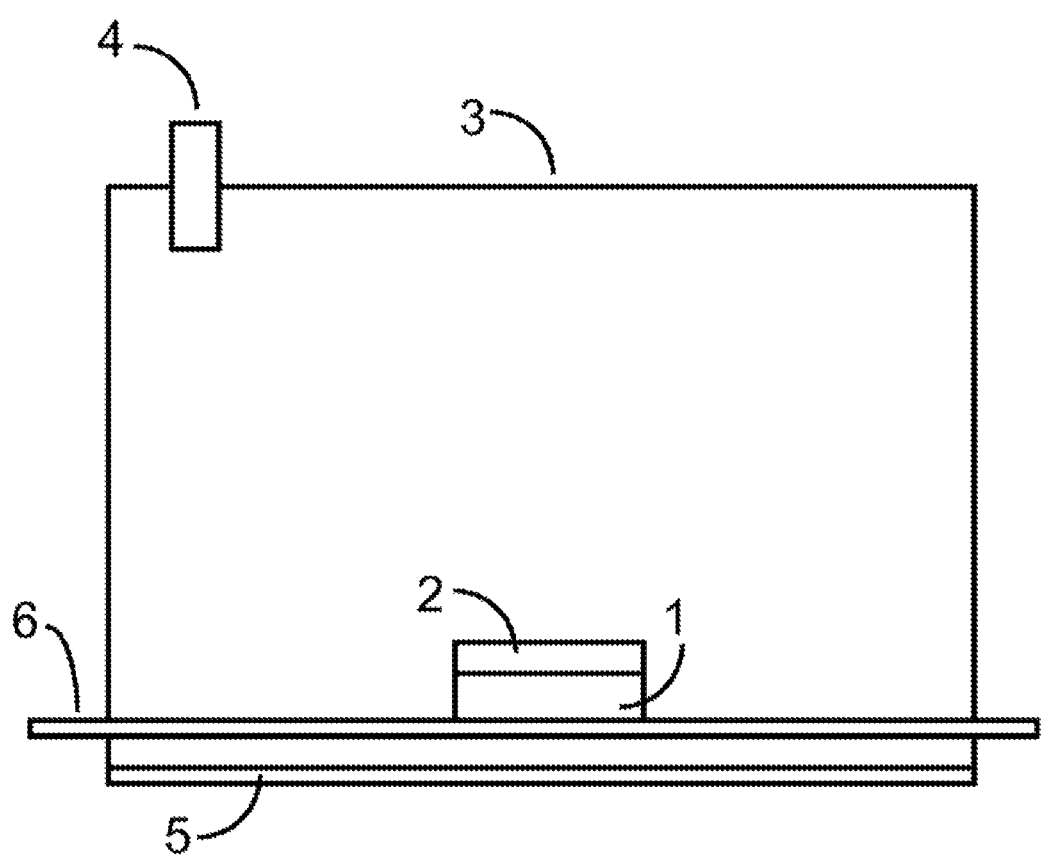

SILICON WAFER FOR AN ELECTRONIC COMPONENT AND METHOD FOR THE PRODUCTION THEREOF

BACKGROUND

The invention relates to a silicon wafer for producing an electronic component, and to a method for the production thereof.

For large-area electronic components such as, for example, large-area illuminants or photovoltaic solar cells, there is a need for cost-effective semiconductor wafers having high electronic quality, since in the case of such components the material costs of the semiconductor wafer represent a significant proportion of the costs of the overall product.

SUMMARY

The present invention is therefore based on the object of improving the quality of the silicon wafer. This object is achieved by a method, a silicon wafer, and the use of a device for epitaxially producing a silicon layer having one or more features of the invention.

The silicon wafer according to the invention is preferably produced by the method according to the invention, in particular a preferred embodiment thereof. The method according to the invention is preferably configured for producing a silicon wafer according to the invention, in particular a preferred embodiment thereof.

The present invention is based on the insight that an electrically active net doping of the silicon wafer represents a crucial target variable during the production of such a wafer which heretofore has not been able to be predefined with high accuracy or has required cost-intensive method steps. In particular, the production of a silicon wafer having a low electrically active net doping or, in the limiting case, having no electrically active net doping has not been possible with high precision or has required cost-intensive method steps.

In this case, the electrically active net doping describes the concentration of the dopants which contribute to the electrical conductivity of the semiconductor material, in contrast to the gross doping, which describes the sum of all doping atoms introduced into the semiconductor layer. In this case, the net doping is always lower than the gross doping, due to the compensation of oppositely polar doping atoms (n-type dopant and p-type dopant) which no longer contribute to the electrical conductivity.

Investigations and problem analyses in previous production methods have revealed that frequently undesired side effects lead to a p-type or an n-type doping of a silicon wafer during the production thereof. In particular, traces of dopants in the starting material to be processed or in the process environment result in the dopants being combined in the wafer in a manner that is difficult to prevent and influence. As a result, either a lower accuracy in the predefinition of an electrically active target doping of the silicon wafer has had to be accepted—particularly in the case of a desired low electrically active net doping or, in the limiting case, when aiming to produce a silicon wafer without electrically active doping—or complex methods have had to be employed to prevent doping substances from being contained in the production method, in particular in a process area in which the silicon is processed to form a silicon wafer.

Therefore, the previous teaching for producing a silicon wafer has always involved attempting to provide exclusively electrically active dopants to the extent of the desired electrically active net doping. This is the case for the known ingot production methods, in particular, since the disadvantages described above occur in particular due to different segregation coefficients of the individual dopants. These disadvantages lead, in particular, to an undesired variation in the net doping concentration.

By contrast, the silicon wafer according to the invention for producing an electronic component has a p-type doping by at least one p-type dopant and an n-type doping by at least one n-type dopant. What is essential is that the electrically active concentration of the p-type doping and of the n-type doping is in each case greater than $1 \times 10^{13}$ cm$^{-3}$.

Consequently, a comparatively high proportion of at least one p-type dopant and one n-type dopant in an electrically active concentration of greater than $1 \times 10^{13}$ cm$^{-3}$ is formed in the silicon wafer according to the invention. The use of these dopants having opposite doping types results in a compensation of the electrically active doping, such that the electrically active net doping is given approximately by the difference in the electrically active density of the two opposite dopings.

As a result, therefore, a base level of at least one $1 \times 10^{13}$ cm$^{-3}$ is predefined and an electrically active net doping of the wafer is determined by way of the difference between the n-type doping concentration and the p-type doping concentration, or vice versa.

This affords considerable advantages:

Due to the base level of $1 \times 10^{13}$ cm$^{-3}$, impurities which are significantly smaller than the base level have no or only a negligible influence on the electrical conductivity of the semiconductor layer. In this regard, considerably greater inaccuracies regarding the presence of doping substances in a process area during the production of the silicon wafer can be tolerated as long as the resulting electrically active density thereof in the produced silicon wafer is small with respect to the base level of $1 \times 10^{13}$ cm$^{-3}$. This results in a considerably lower requirement in respect of the accuracy of the gas composition in such a process chamber and thus a cost saving.

Furthermore, the present invention makes it possible to produce silicon wafers having no or low electrically active net doping in a cost-effective manner with high precision: it is considerably easier in terms of process engineering to form an equal balance of the electrically active p-type doping and the electrically active n-type doping in the case of a doping level of at least $1 \times 10^{14}$ cm$^{-3}$ or to bring about a small difference between the p-type and the n-type doping in order to form a low electrically active net doping. This is accounted for firstly by the already mentioned impurities that lead to electrically active dopings.

Likewise, the combination of the dopants in a process chamber is handleable more easily in terms of control engineering if, for the presence of a p-type dopant and for the presence of an n-type dopant, values are predefined which lead to an electrically active doping of greater than $1 \times 10^{14}$ cm$^{-3}$ and are thus comparatively large relative to values predefined heretofore. Overall, therefore, the material flow, in particular the gas flow, when introducing doping substances into a process chamber in the case of the present invention is handleable considerably more easily since comparatively greater concentrations of p-type dopant and n-type dopant are chosen in order to achieve the base level of at least $1 \times 10^{14}$ cm$^{-3}$.

The object mentioned in the introduction is furthermore achieved by a method for producing a silicon wafer for an electronic component with one or more features of the invention. The method according to the invention comprises a method step of epitaxially growing a silicon layer on a carrier substrate, and of detaching the silicon layer as silicon wafer from the carrier substrate. At least one p-type dopant and at least one n-type dopant are introduced into the silicon layer during the epitaxial growth in order to form an electrically active doping.

What is essential is that the dopants are introduced into the silicon layer in such a way that the silicon layer is formed with an electrically active p-type doping and an electrically active n-type doping of in each case greater than $1 \times 10^{13}$ cm$^{-3}$.

A silicon wafer produced in this way thus has the advantages described above. Furthermore, the described method of epitaxially growing a silicon layer on a carrier substrate and detaching the silicon layer as silicon wafer from the carrier substrate is particularly suitable for producing such a silicon wafer:

In order to produce silicon wafers, heretofore methods have been widely used in which semiconductor wafers are produced from silicon blocks ("ingots") using sawing methods. These ingots are crystallized from a melt of the semiconductor. This crystallization is subject to diffusion processes leading to an unequal distribution of the dopants in the crystal in accordance with the Scheil equation. In this case, the change in concentration is element-specific and can be influenced only with considerable outlay in a continuous crystallization process. During a crystallization, raising the base doping level for n-type dopant and p-type dopant thus leads to a stable net doping only with considerable technical outlay, and rather to a significantly intensified inhomogeneity of the doping level over the length of the crystal.

The method of epitaxially growing a silicon layer on a carrier substrate and subsequently detaching the silicon layer as silicon wafer is known per se and described for example in R. Brendel, *Review of Layer Transfer Processes for Crystalline Thin-Film Silicon Solar Cells*, Japanese Journal of Applied Physics, 2001, 40 (7R), p. 4431.

The method according to the invention thus modifies the known method for producing a silicon wafer by epitaxial growth by virtue of the fact that both at least one p-type dopant and at least one n-type dopant are provided during the growth in such a way that an electrically active p-type doping of at least $1 \times 10^{13}$ cm$^{-3}$ and an electrically active n-type doping of at least $1 \times 10^{13}$ cm$^{-3}$ form in the silicon layer.

The advantages mentioned above are intensified if, in one preferred embodiment, a higher base level of the electrically active p-type and n-type dopings is chosen, in particular by virtue of the fact that the silicon wafer has an electrically active concentration of the p-type doping and of the n-type doping of in each case greater than $5 \times 10^{14}$ cm$^{-3}$, preferably $1 \times 10^{15}$ cm$^{-3}$, in particular $5 \times 10^{15}$ cm$^{-3}$. In particular the electrically active concentration of the p-type doping and of the n-type doping is advantageously in the range of $1 \times 10^{14}$ cm$^{-3}$ to $1 \times 10^{16}$ cm$^{-3}$. It is likewise advantageous to configure the method according to the invention for forming a silicon wafer with such parameters.

As already mentioned, it is possible with a higher accuracy or at least in a considerably more cost-effective manner to produce a low electrically active net doping at a base level of a p-type and an n-type doping of at least $1 \times 10^{14}$ cm$^{-3}$.

The silicon wafer according to the invention is therefore preferably formed as a so-called high-resistance wafer. In this advantageous embodiment, the silicon wafer has an electrically active net doping, such that the silicon wafer has an electrical resistivity of greater than 1 Ωcm, preferably greater than 5 Ωcm, in particular greater than 20 Ωcm. Such high-resistance wafers are particularly of interest for use as high-efficiency solar cells in which, under illumination, the electrical conductivity is determined by charge carriers produced by light absorption, and only secondarily by doping atoms introduced into the material.

Alternatively or additionally, the silicon wafer is preferably formed with an electrically active net doping of at least $5 \times 10^{14}$ cm$^{-3}$, in particular in the range of $5 \times 10^{14}$ cm$^{-3}$ to $1 \times 10^{16}$ cm$^{-3}$, preferably in the range of $5 \times 10^{14}$ cm$^{-3}$ to $5 \times 10^{15}$ cm$^{-3}$. The electrically active net doping describes the difference between the electrically active p-type doping and the electrically active n-type doping, wherein in each case the doping type having the smaller doping is subtracted from the doping type having the higher doping in order to determine the electrically active net doping (of the doping type having the higher doping).

Correspondingly, in one advantageous embodiment, the method is configured in such a way as to produce a silicon wafer having the parameters mentioned above.

During the production of an electronic component, it is desirable to find precisely defined dopings, in particular precisely defined electrically active net dopings, since the latter can influence important electronic properties such as, for example, charge carrier mobilities or charge carrier recombination rates.

The base level of electrically active p-type and n-type doping of at least $1 \times 10^{14}$ cm$^{-3}$ in the wafer according to the invention thus also makes it possible, as described above, to precisely predefine the profile of the electrically active net doping in particular in the thickness direction, i.e. perpendicular to a front side of the silicon wafer. It is therefore advantageous for the silicon wafer to have an electrically active net doping that is substantially constant in the thickness direction. Correspondingly, the method is advantageously configured in such a way that the silicon layer is formed with an electrically active net doping that is substantially constant in the thickness direction.

Alternatively, the possibility of precisely predefining the electrically active net doping also opens up the possibility, however, of predefining the profile of the electrically active net doping in the thickness direction in a targeted manner. In this regard, in one advantageous embodiment, the silicon wafer has an electrically active net doping that has a stepped profile or a linear profile in the thickness direction. This is advantageous, in particular, in order to form, in photovoltaic solar cells, so-called "back surface fields" (BSF) or drift fields that can effectively reduce the charge carrier recombination at the wafer surface or in the bulk. The same applies to so-called "front surface fields" (FSF).

Correspondingly, the method according to the invention is preferably configured in such a way that the silicon layer has such a profile of the electrically active net doping.

It is thus possible, in particular, to achieve a profile of the electrically active net doping in the thickness direction which deviates over a typical profile during the production of a silicon wafer from ingots. It is often desirable to avoid this typically exponential profile, in particular profile in accordance with Scheil's law. Therefore, the silicon wafer according to the invention advantageously has an electrically active net doping having a non-exponential profile, in particular no profile in accordance with Scheil's law, in the thickness direction. The formation of such a silicon wafer is possible in particular by the method according to the invention.

In the method according to the invention, preferably the silicon layer is applied with a thickness of at least 50 µm, in particular of at least 100 µm, in particular preferably with a thickness in the range of 50 µm to 350 µm. Correspondingly, the silicon wafer according to the invention advantageously has a thickness of at least 50 µm, in particular at least 100 µm, in particular preferably a thickness in the range of 50 µm to 350 µm.

In terms of process engineering, it is particularly simple and thus cost-effective, in one preferred embodiment in the method according to the invention, to simultaneously introduce gases containing the n-type dopant, the p-type dopant and containing silicon for the purpose of epitaxially growing the silicon layer in a process chamber.

In terms of process engineering, it is likewise simple and cost-effective, in one preferred embodiment, to introduce at least one dopant into the process by way of solid doping sources, e.g. phosphorus glass or boron glass or ceramics containing phosphorus or boron.

The silicon wafer according to the invention is suitable in particular for forming large-area semiconductor components, such as, for example, large-area light-generating components such as LEDs.

The silicon wafer according to the invention is preferably used for producing a photovoltaic solar cell since, particularly in the case of a photovoltaic solar cell, the total costs depend considerably on the quality and the costs of the semiconductor layer used and a precise predefinition of the electrically active net doping is desirable particularly in the case of a photovoltaic solar cell. Preferably, therefore, the silicon wafer is configured for producing a photovoltaic solar cell; in particular, the silicon wafer covers at least an area of at least 10×10 cm², such that a front side and a backside of the silicon wafer in each case have at least an area of 10×10 cm². Alternatively or additionally, it is advantageous for the silicon wafer to have a charge carrier lifetime of at least 300 µs, preferably at least 500 µs, and/or for the silicon wafer to have a thickness in the range of 30 µm to 300 µm, in particular in the range of 50 µm to 200 µm.

As described above, devices are already known for epitaxially growing a silicon layer on a carrier substrate. The object mentioned in the introduction is therefore furthermore achieved by a use of a device for epitaxially producing a silicon layer, wherein the device comprises a process chamber for receiving a carrier substrate, and a heating device for heating the process chamber, and at least one gas inlet into the process chamber. The device is configured for producing a silicon wafer having a p-type doping by at least one p-type dopant and an n-type doping by at least one n-type dopant, wherein the electrically active density of the p-type doping and of the n-type doping is in each greater than $1\times10^{14}$ cm$^{-3}$.

BRIEF DESCRIPTION OF THE DRAWING

Further preferred features and embodiments are explained below with reference to the FIGURES of the exemplary embodiment.

In this case:

FIG. 1 shows one exemplary embodiment of a device for carrying out one exemplary embodiment of the method according to the invention.

DETAILED DESCRIPTION

FIG. 1 shows a device for epitaxially producing a silicon layer. The device comprises a process chamber 3 for receiving a carrier substrate 1. The carrier substrate 1 can be moved into and out of the process chamber 3 by a conveying device 6 in the form of a conveyor belt. For this purpose, the process chamber 3 has locks.

The process chamber 3 is heatable by a heating device 5. Furthermore, a gas stream can be introduced into the process chamber 3 via a gas inlet 4. Gas can be discharged from the process chamber via a gas outlet.

The device illustrated in FIG. 1 and its operation can be implemented, in principle, in a manner known per se, in particular as described in WO 2012/084187 or DE 10 2015 118 042.

In one exemplary embodiment of a method according to the invention, a surface (top surface in FIG. 1) of the carrier substrate 1 is firstly porosified. The porosification of a carrier substrate is known per se and serves, in particular, to be able to detach the epitaxially grown silicon layer from the carrier substrate. The carrier substrate itself is likewise formed from silicon.

The carrier substrate that has been pretreated in this way is moved into the process chamber 3 by the conveying device 6, as far as the approximately central position as illustrated in FIG. 1. This is followed by epitaxially growing a silicon layer 2, wherein the process chamber 3 is heated by the heating device 5 and silicon-containing silane or chlorosilane gas and for example diborane gas containing boron as p-type dopant and phosphine gas containing phosphorus as n-type dopant are introduced via the gas inlet 4. Alternatively, a plurality of gas inlets can be provided, in particular one or more separate gas inlets for each gas.

The process of epitaxially growing the silicon layer 2 is carried out with process parameters that are substantially known per se. One essential difference is that the gases which contain the p-type dopant and the n-type dopant are supplied in such a high concentration that the silicon layer is formed in the present case with an electrically active p-type doping of $1\times10^{14}$ cm$^{-3}$ in the present case and with an electrically active n-type doping of $6\times10^{14}$ cm$^{-3}$ in the present case.

The silicon layer thus has an electrically active net doping of the n doping type of $5\times10^{14}$ cm$^{-3}$ and is thus formed as a high-resistance silicon layer with approximately 10 Ωcm.

Typical process parameters that can be used for this process are 1050° C. process temperature, a flow rate of 50 standard liters/minute hydrogen, 1 standard liter/minute chlorosilane, 0.002 standard liter/minute phosphine dissolved in hydrogen and 0.001 standard liter/minute diborane dissolved in hydrogen.

Afterward, the carrier substrate 1 with the silicon layer 2 is moved out of the process chamber 3 by the conveying device 6 and the silicon layer 2 is released from the carrier substrate 1. The detached silicon layer 2 thus corresponds to one exemplary embodiment of a silicon wafer according to the invention.

The carrier substrate has an approximately square surface having an edge length of 10 cm in the present case, such that the resulting silicon wafer also has approximately these dimensions. The resulting silicon wafer has a thickness of 100 µm in the present case.

In this exemplary embodiment, the concentration both of the n-type dopant and of the p-type dopant was kept constant during the epitaxial growth, such that the silicon layer 2 has an active net doping that is constant in the thickness direction (perpendicular to the front side of the silicon layer 2, said front side being at the top in FIG. 1).

Alternatively, in a further exemplary embodiment, the gas flow can be varied during the epitaxial growth, such that the silicon layer 2 has an electrically active net doping that has a stepped profile or a linear profile in the thickness direction. In this case, preferred profiles are a stepped or linear profile proceeding from an electrically active net doping of $1\times10^{14}$ cm$^{-3}$ at the surface of the silicon layer 2 facing the carrier substrate to an electrically active net doping of $1\times10^{15}$ cm$^{-3}$ at the side of the silicon layer 2 facing away from the carrier substrate 1 (the front side of the silicon layer 2).

In the case of a stepped profile, steps with a relative concentration change of 10-30%, proceeding from the lower doping level, are advantageous.

These three profiles mentioned above, of the constant, stepped or linear active net doping, have in common the fact that no exponential profile typical of ingot production methods is present, in particular no profile in accordance with Scheil's law.

The invention claimed is:

1. A method for producing a silicon wafer for an electronic component, the method comprising:
   epitaxially growing a silicon layer (2) on a carrier substrate (1);
   detaching the silicon layer (2) as a silicon wafer from the carrier substrate;
   introducing at least one p-type dopant and at least one n-type dopant into the silicon layer (2) during the epitaxial growth; and
   introducing the dopants into the silicon layer (2) such that the silicon layer (2) is formed with an electrically active p-type doping and an electrically active n-type doping in each case with a concentration in a range of $1\times10^{14}$ cm$^{-3}$ to $1\times10^{16}$ cm$^{-3}$.

2. The method as claimed in claim 1, wherein the silicon layer (2) is formed with an electrically active net doping, such that the silicon wafer has a sheet resistance of greater than 1 Ωcm, or the silicon wafer is formed with an electrically active net doping of at least $1\times10^{14}$ cm$^{-3}$, or both.

3. The method as claimed in claim 1, wherein the silicon layer (2) is formed with an electrically active net doping that is substantially constant in a thickness direction.

4. The method as claimed in claim 1, wherein the silicon layer (2) is formed with an electrically active concentration of the p-type doping and of the n-type doping of in each case greater than $5\times10^{14}$ cm$^{-3}$.

5. The method as claimed in claim 1, wherein the epitaxially applied silicon layer (2) has a thickness of at least 50 µm.

6. The method as claimed in claim 1, wherein gases containing the n-type dopant, the p-type dopant, and silicon are simultaneously introduced in a process chamber (3) for epitaxially growing the silicon layer (2).

7. The method of claim 1, further comprising using a device for epitaxially producing the silicon layer (2), with the device comprising a process chamber (3) for receiving the carrier substrate, a heating device (5) for heating the process chamber (3), and at least one gas inlet (4) into the process chamber (3), for producing the silicon wafer having the p-type doping formed by the at least one p-type dopant and the n-type doping formed by the at least one n-type dopant.

* * * * *